United States Patent
Nicholas

(10) Patent No.: US 9,208,027 B2
(45) Date of Patent: Dec. 8, 2015

(54) ADDRESS ERROR DETECTION

(71) Applicant: International Business Machines Corporation, Armonk, NY (US)

(72) Inventor: Richard Nicholas, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/540,356

(22) Filed: Nov. 13, 2014

(65) Prior Publication Data

US 2015/0074495 A1     Mar. 12, 2015

Related U.S. Application Data

(62) Division of application No. 13/241,598, filed on Sep. 23, 2011, now Pat. No. 8,949,694.

(51) Int. Cl.
  *G11C 29/00* (2006.01)
  *G06F 11/10* (2006.01)
  *H03M 13/05* (2006.01)

(52) U.S. Cl.
  CPC ........ *G06F 11/1076* (2013.01); *G06F 11/1016* (2013.01); *H03M 13/05* (2013.01)

(58) Field of Classification Search
  CPC . G06F 11/1016; G06F 11/1076; H03M 13/05
  See application file for complete search history.

(56) References Cited

U.S. PATENT DOCUMENTS

| | | |
|---|---|---|
| 5,321,706 A | 6/1994 | Holm et al. |
| 5,537,425 A | 7/1996 | Tsou |
| 5,659,549 A | 8/1997 | Oh et al. |
| 5,663,969 A | 9/1997 | Tsou |
| 5,691,996 A | 11/1997 | Chen et al. |
| 5,737,744 A | 4/1998 | Callison et al. |
| 5,761,221 A | 6/1998 | Baat et al. |
| 5,768,294 A | 6/1998 | Chen et al. |
| 6,742,159 B2 | 5/2004 | Sakurai |
| 6,751,769 B2 | 6/2004 | Chen et al. |
| 6,754,858 B2 | 6/2004 | Borkenhagen et al. |
| 6,918,007 B2 | 7/2005 | Chang et al. |
| 6,971,041 B2 | 11/2005 | DeSota et al. |
| 7,185,208 B2 | 2/2007 | Gorobets |
| 7,203,890 B1 | 4/2007 | Normoyle |
| 7,293,221 B1 | 11/2007 | Wong et al. |

(Continued)

FOREIGN PATENT DOCUMENTS

JP       2007052689 A       3/2007

OTHER PUBLICATIONS

U.S. Appl. No. 13/241,598; Notice of Allowance; Date Filed Sep. 23, 2011; Date Mailed: Sep. 22, 2014; 9 pages.

*Primary Examiner* — Sam Rizk
(74) *Attorney, Agent, or Firm* — Cantor Colburn LLP

(57) ABSTRACT

Address error detection including a method that receives a read address corresponding to a read location in a memory. Data is read from the read location in the memory. The data is transformed at a computer based on the data and the read address to produce read data. Error correction codes (ECC) bits associated the read data are read from the read location in the memory. The ECC bits were generated based on the write data. It is determined whether the read data has an address error responsive to the read data and the ECC bits associated with the write data. An error is generated in response to determining that the read address has an address error.

5 Claims, 8 Drawing Sheets

(56) References Cited

U.S. PATENT DOCUMENTS

| | | |
|---|---|---|
| 7,328,392 B2 | 2/2008 | Chikusa et al. |
| 7,337,352 B2 | 2/2008 | DeSota |
| 7,398,449 B1 | 7/2008 | Normoyle et al. |
| 7,761,779 B2 | 7/2010 | Kanai et al. |
| 7,877,647 B2 | 1/2011 | Riley |
| 8,099,651 B2 | 1/2012 | Normoyle et al. |
| 8,566,672 B2 | 10/2013 | Moyer et al. |
| 8,607,121 B2 | 12/2013 | Moyer |
| 2001/0056567 A1* | 12/2001 | Sakurai ............ 714/805 |
| 2006/0156191 A1 | 7/2006 | Driediger |
| 2006/0236205 A1 | 10/2006 | Kuramoto et al. |
| 2007/0136647 A1 | 6/2007 | Kanai et al. |
| 2008/0235558 A1 | 9/2008 | Normoyle et al. |

* cited by examiner

ADDRESS ERROR DETECTION

DOMESTIC PRIORITY

The present application is a divisional of U.S. patent application Ser. No. 13/241,598, filed Sep. 23, 2011, the content of which is incorporated by reference herein in its entirety.

BACKGROUND

The present invention relates generally to computer memory, and more particularly to providing address error detection in a memory system.

Computer systems often require a considerable amount of high speed random access memory (RAM) to hold information such as operating system software, programs, and other data while a computer is powered on and operational. This information is normally binary, composed of patterns of 1's and 0's known as bits of data. The bits of data are often grouped and organized at a higher level. A byte, for example, is typically composed of 8 bits; more generally these groups are called symbols and may consist of any number of bits.

Memory device densities have continued to grow as computer systems have become more powerful. Currently it is not uncommon to have the RAM content of a single computer be composed of hundreds of trillions of bits. Unfortunately, the failure of just a portion of a single RAM device can cause the entire computer system to fail. When memory errors occur, which may be "hard" (repeating) or "soft" (one-time or intermittent) failures, these failures may occur as single cell, multi-bit, full chip or full memory module failures and all or part of the system RAM may be unusable until it is repaired. Repair turn-around-times can be hours or even days, which can have a substantial impact to a business dependent on the computer systems.

The probability of encountering a RAM failure during normal operations has continued to increase as the amount of memory storage in contemporary computers continues to grow.

Techniques to detect and correct bit errors have evolved into an elaborate science over the past several decades. Perhaps the most basic detection technique is the generation of odd or even parity where the number of 1's or 0's in a data word are "exclusive or-ed" (XOR-ed) together to produce a parity bit. For example, a data word with an even number of 1's will have a parity bit of 0 and a data word with an odd number of 1's will have a parity bit of 1, with this parity bit data appended to the stored memory data. If there is a single error present in the data word during a read operation, it can be detected by regenerating parity from the data and then checking to see that it matches the stored (originally generated) parity.

More sophisticated codes allow for detection and correction of errors that can affect groups of bits rather than individual bits. Reed-Solomon codes are an example of a class of powerful and well understood codes that can be used for these types of applications.

These error detection and error correction techniques are commonly used to restore data to its original/correct form in noisy communication transmission media or for storage media where there is a finite probability of data errors due to the physical characteristics of the device. Memory devices generally store data as voltage levels representing a 1 or a 0 in RAM and are subject to both device failure and state changes due to high energy cosmic rays and alpha particles.

Contemporary memory devices are often sensitive to alpha particle hits and cosmic rays causing memory bits to flip. These particles do not damage the device but can create memory errors. These are known as soft errors, and most often affect just a single bit. Once identified, the bit failure can be corrected by simply rewriting the memory location. The frequency of soft errors has grown to the point that it has a noticeable impact on overall system reliability.

Memory error correction codes (ECCs) use a combination of parity checks in various bit positions of the data word to allow detection and correction of errors. Every time data words are written into memory, these parity checks need to be generated and stored with the data. Upon retrieval of the data, a decoder can use the parity bits thus generated together with the data message in order to determine whether there was an error and to proceed with error correction if feasible.

SUMMARY

An embodiment is a method that includes receiving a read address corresponding to a read location in a memory. Data is read from the read location in the memory. The data is transformed at a computer based on the data and the read address to produce read data. ECC bits associated the read data are read from the read location in the memory. The ECC bits were generated based on the write data. It is determined whether the read data has an address error responsive to the read data and the ECC bits associated with the write data. An error is generated in response to determining that the read address has an address error.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments described herein provide an error correction code (ECC) enhancement that detects address errors when accessing data stored in a memory. Embodiments detect address errors that occur during write operations as well as address errors that occur during read operations. Data being stored at an incorrect address due to an address error during a write operation causes at least two data storage errors to occur: the data will write over "good" data in memory that was intended to be retained, and the data will not be accessible at the intended address in memory. Data being read from the wrong location due to an address error during a read operation will cause the wrong data to be returned to the requestor of the data.

In accordance with embodiments described herein, write data is encoded based on the address where the write data is supposed to be stored. This address based transform on the write data provides a check that the data was written to and subsequently read from the correct address in memory. During a write operation, the address based transform is performed on the write data, using the memory address, to create transformed write data. The transformed write data is written to memory along with ECC bits for the write data (calculated based on the write data prior to the transform). During a read operation, the address based transform is used to transform the data read from the memory location back to the originally written write data. After the data is read from memory and transformed based on the address, ECC is applied to check if there are errors in the data. The transform is configured to cause a major or uncorrectable error (UE) in the data if the data is written to or accessed from the wrong address (i.e., when there is a mismatch between the data read and the address). This allows the ECC to identify address errors when accessing data stored in memory.

Typically ECC checks identify both major and minor errors, and correct minor errors. If the error is large enough that it cannot be corrected, the error is identified as an UE. In the case where an address error has occurred, the transform based on the address will cause the ECC check to identify an UE. The embodiment provides address error checking for data storage in memory that does not affect latency or transaction time for reading from or writing to memory. Further, the embodiment does not add information to be stored with the data, thereby providing an address check without affecting the memory used for data storage.

Figure 1:
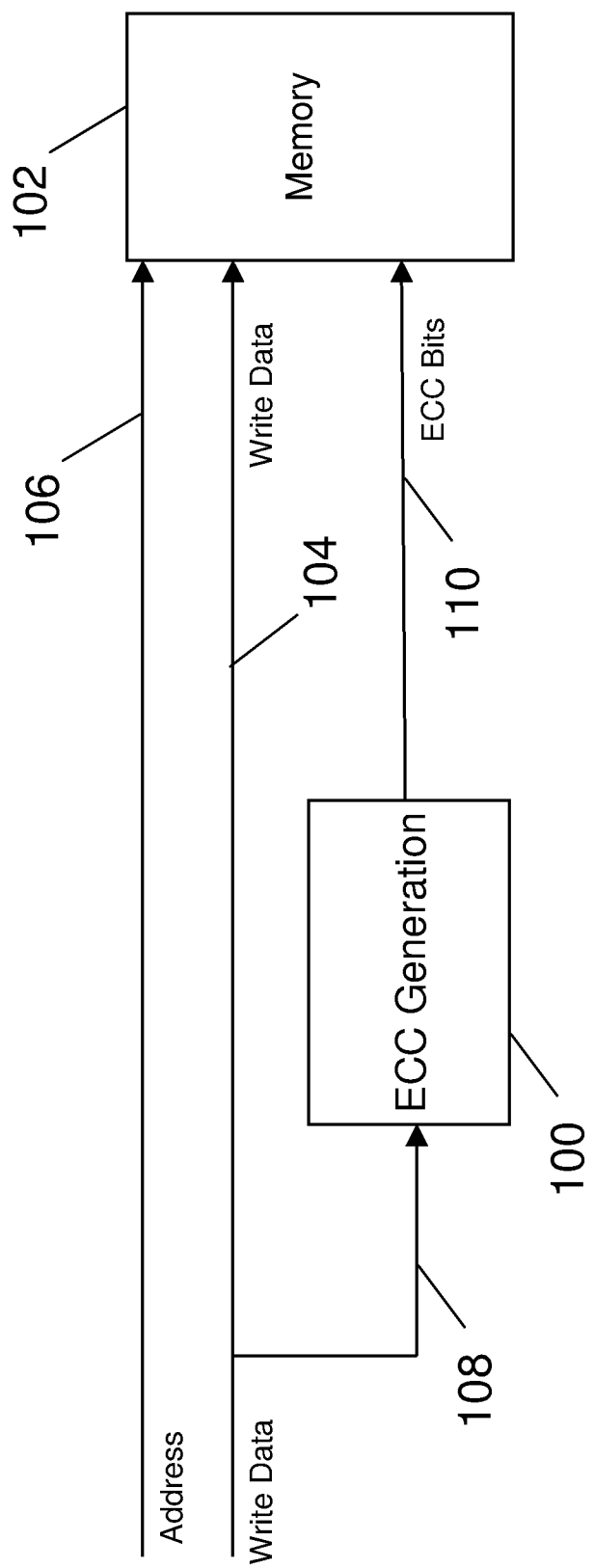
FIG. 1 is a block diagram of a contemporary system for writing data to memory.

FIG. 1 is a block diagram of a contemporary system for writing data to memory. The system includes an ECC generation block 100 for generation of ECC bits 110. The ECC generation block 100 is located on any suitable portion of a computing or processing system, including, but not limited to, a memory controller and/or a memory module. The ECC generation block 100 receives write data 108, which is then used to generate ECC bits 110. The ECC bits 110 and write data 104 are written to an address 106 corresponding to a location in memory 102 (or memory buffer). The ECC bits 110 are used to identify errors in the data 104 when the data 104 is read back from the memory 102. In some cases, however, the data 104 is not in error, however, an error occurs because the data 104 and ECC bits 110 have been written to the wrong address 106.

Figure 2:
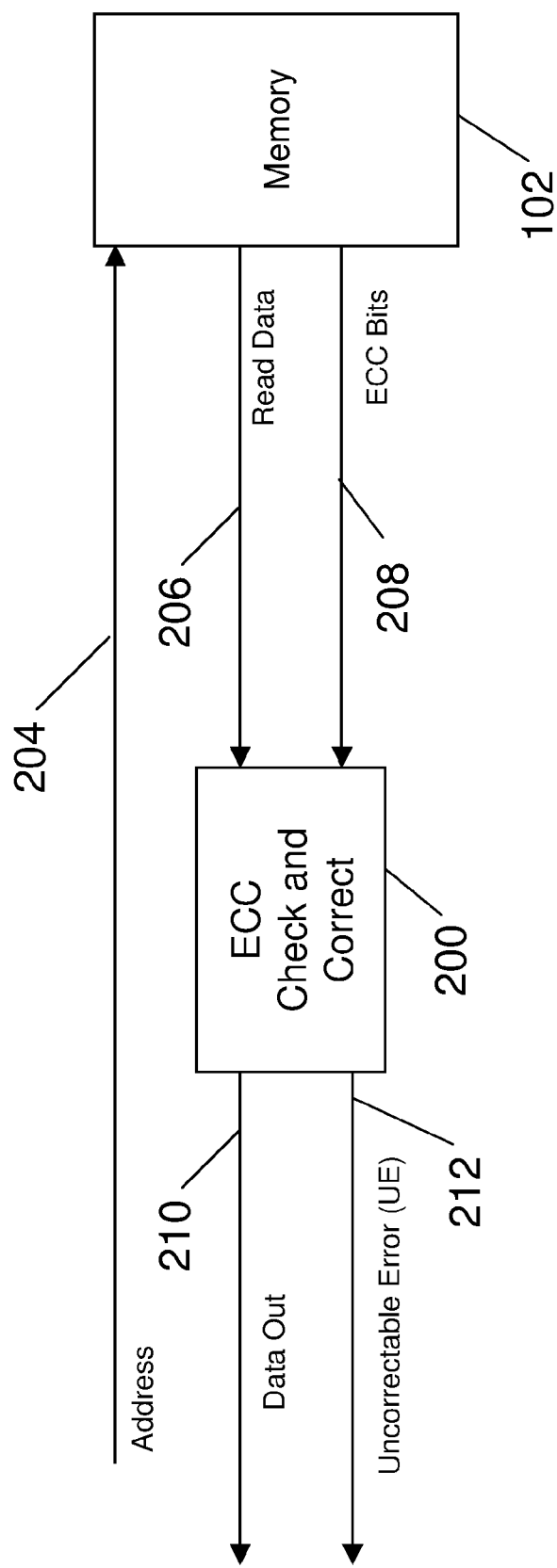
FIG. 2 is a block diagram of a contemporary system for reading data from memory.

FIG. 2 is a block diagram of a contemporary system for reading data from memory 102. The depicted system receives an address 204 corresponding to a location in a memory 102 where read data 206 is located along with corresponding ECC bits 208. The ECC check and correct block 200 detects errors by checking the read data 206 against the ECC bits 208. The ECC bits 208 may be used to identify minor or major errors in the read data 206, and in certain cases, minor errors are corrected by the ECC check and correct block 200. Regardless of whether the data error was corrected, data out 210 is sent from the system. Major errors in the data 206 are identified by the ECC check and correct block 200 and will result in an UE 212. Thus, the system identifies the UE and notifies the system, user and/or other appropriate entities. In some cases, the ECC bits 208 cannot identify that the data 206 was written to the wrong address 204, which can cause incorrect data to be read, without notice to the system or user.

Figure 3:
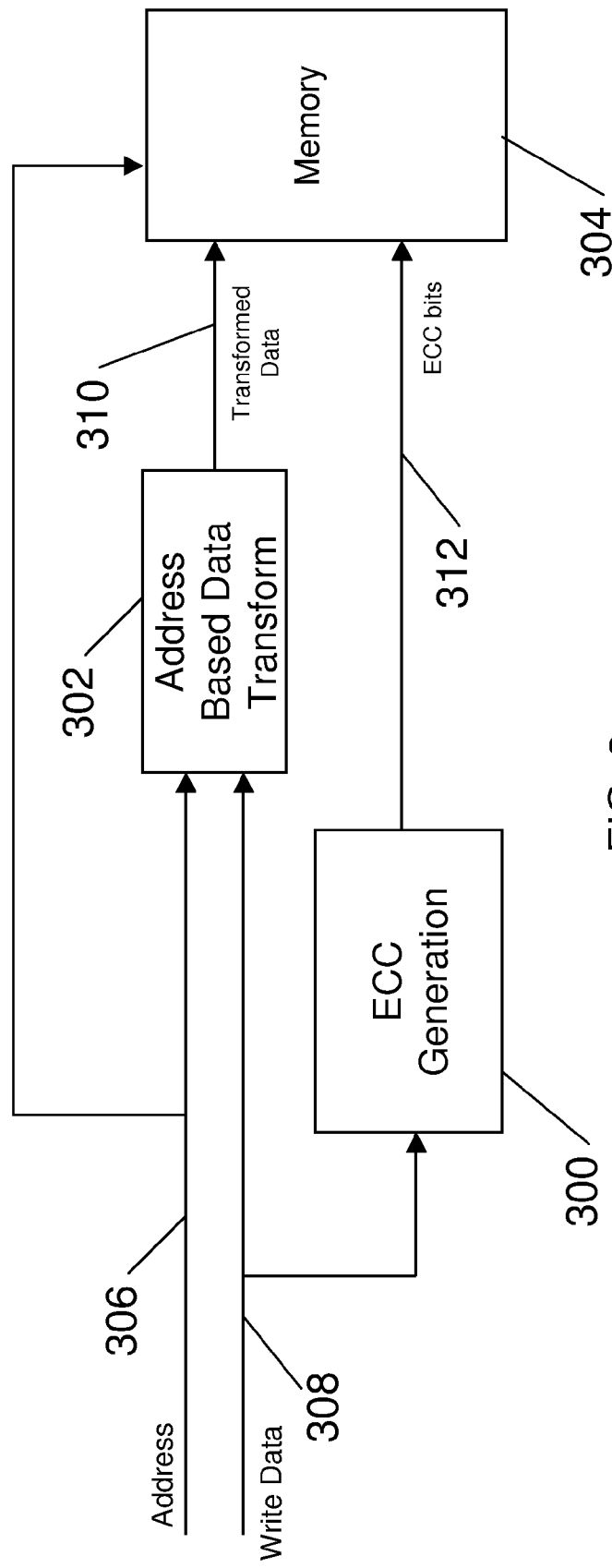
FIG. 3 is a block diagram of a system for writing data to memory with address error identification in accordance with an embodiment.

FIG. 3 is a block diagram of a system for writing data to memory with address error identification in accordance with an embodiment. An ECC generation block 300 and an address based data transform block 302 are executed by a processor located in any suitable part of a computing system, including, but not limited to, a memory controller and/or a memory module. The ECC generation block 300 receives write data 308 (e.g., on a data bus made up of one or more wires), which is used to generate ECC bits 312 associated with the write data 308. The address based data transform block 302 receives the write data 308 and an address 306 (e.g., on an address bus made up of one or more wires) corresponding to a location in a memory 304 (or memory buffer) where the write data 308 will be written. The address based data transform block 302 performs a transform on the write data 308 based on the address 306 to produce transformed data 310 that is written along with the ECC bits 312 to a location in memory 304 corresponding to the address 306. In an embodiment, the address based data transform block 302 performs a transformation of each bit of the write data 308 based on the received write address 306. A write address 307 is the actual address in memory where the write data 308 is written. If address 307 is corrupted or an error occurs as the system writes write data 308 to address 307 (e.g., address 307 does not match address 306), the transformed data 310 will be written to the wrong location in memory 304. The transformation of the write data 308 by the address based data transform block 302, which will be described in detail below, will cause an UE to occur when the data is read back by a read command at the address 307.

Figure 4:
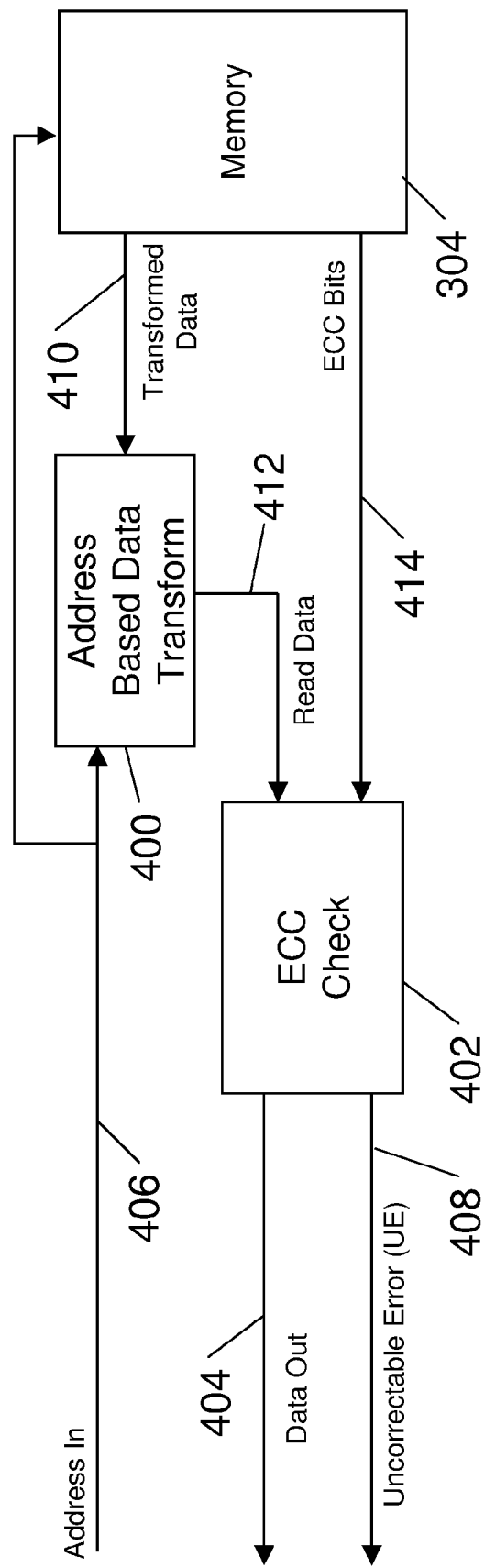
FIG. 4 is a block diagram of a system for reading data from memory with address error identification in accordance with an embodiment.

FIG. 4 is a block diagram of a system for reading data from memory with data and address error identification in accordance with an embodiment. An ECC check block 402 and address based transform block 400 are executed by a processor located in any suitable part of a computing system, including, but not limited to, a memory controller and/or a memory module. An address 406 is communicated or sent to the memory 304, and transformed data 410 (also referred to as "stored data") is read from a location in the memory 304. In an embodiment where there is no address error during the read process, the address 406 corresponds to a read address 408 that is used at a bus of the memory 404 to read data. The address based data transform block 400 receives the transformed data 410 from the location in the memory 304 that corresponds to the address 408 and transforms the transformed data 410 into read data 412 using address 406. As discussed below, the address based data transform block 400 uses a suitable mechanism based on the address 406 to transform the transformed data 410 into read data 412. The address based data transform block 400 provides a method for checking that the read data 412 was written to the correct address and corresponding location in memory 304. In addition, the address based transform block 400 provides a method for checking that the address read in the memory (read address 408) is the same as the address that was sent (address 406).

The method performs these checks without increasing latency (i.e., time for reading/writing data) or increasing memory usage.

The ECC check block 402 receives ECC bits 414 associated with the read data 412 and checks to determine if there are errors in the read data 412. In an embodiment, if the transformed data 310 in FIG. 3 is written to an incorrect address, then when the data is read from memory 304, the transformed data 410 will be transformed based on the actual location of the data (which was incorrect when written) and, therefore, will cause an error to be determined when the read data 412 is checked by the ECC check block 402. The ECC check block 402 outputs data out 404 (the read data 412). As depicted, any error caused by the address based data transform block 400 will be indicated to the system and/or user as a major or uncorrectable error ("UE") 416. Thus, if data or a block of data is written to the incorrect address, the depicted arrangement and system generates an error indication to the system and/or user. If a UE is not generated at the ECC check block 402, then this indicates that the data was written to the correct address. Further, the exemplary address based data transform block 400 performs a substantially basic transform operation on the data and, therefore, will not affect latency for the read operation or write operation.

In an example, write data 308 is transformed to transformed data 310 (as shown in FIG. 3) before it is written to the memory 304 at write address 306. In FIG. 4, if the data is written to the correct address, a read of the transformed data 410 at read address 406 will be transformed to read data 412 based on read address 406. If the read address 406 matches write address 306, the read data 412 is the same as write data 308 and will not produce an address-based error.

Referring to FIGS. 3 and 4, embodiments of the system for reading data from memory 404 with data and address error identification may also indicate address errors (i.e., UEs) in the read operation. In an example, the write data 308 is transformed and written to the correct address 307 as transformed data 310, wherein address 306 matches address 307. The system for reading data produces an UE if an error occurs, such as a corrupted read address 408, which does not match read address 406. The resulting transformed data 412 from the addressed based transform block 410 will not match the write data (prior to transform) originally wrote to the read address 408, due to the mismatching of addresses 408 and 406. Accordingly, the transformed data 412 produces an UE error as identified by ECC block 402. Accordingly, the system is also configured to determine address errors that may occur during data read operations from memory.

Figure 5:
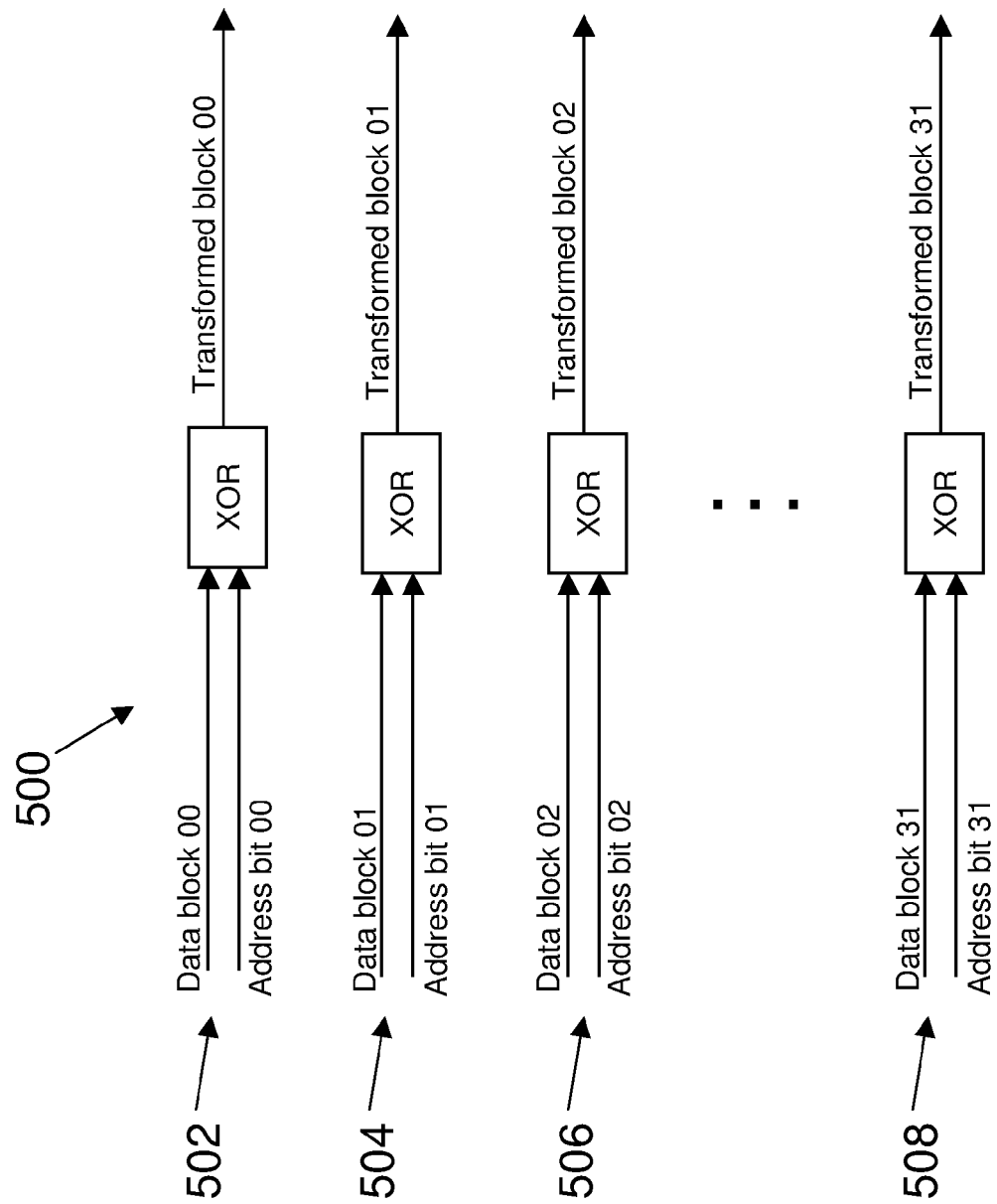
FIG. 5 is a block diagram of a transform system and process configured to transform data written to memory to provide address error checking in accordance with an embodiment.

FIG. 5 is a block diagram of an exemplary transform system and process 500 configured to transform data written to memory to provide address error checking. The exemplary process 500 may be a portion of the address based data transform block 302 shown in FIG. 3. Further, the transform or process 500 may also be used in address based data transform block 400 in FIG. 4. The data to be written (write data 308 in FIG. 3) is received and is broken up into data blocks of any suitable size. As depicted, the data is broken into 32 blocks of equal size, where each block corresponds to a bit of the address (306 in FIG. 3), wherein the exemplary address is 32 bits. In process 502, a first data block 00 is transformed based on a value of an assigned corresponding first address bit 00 using an XOR bitwise logical operation to produce a transformed block 00 of data. It should be understood that any suitable basic bitwise operation, based on, or responsive to, the value of an assigned corresponding address bit, may be performed on the data. The exemplary XOR bitwise operation changes the bit value (0 to 1 or 1 to 0) if the address bit is a 1. The XOR bitwise operation maintains the bit value (0 remains 0 or 1 remains 1) if the address bit is a 0.

Figure 6:
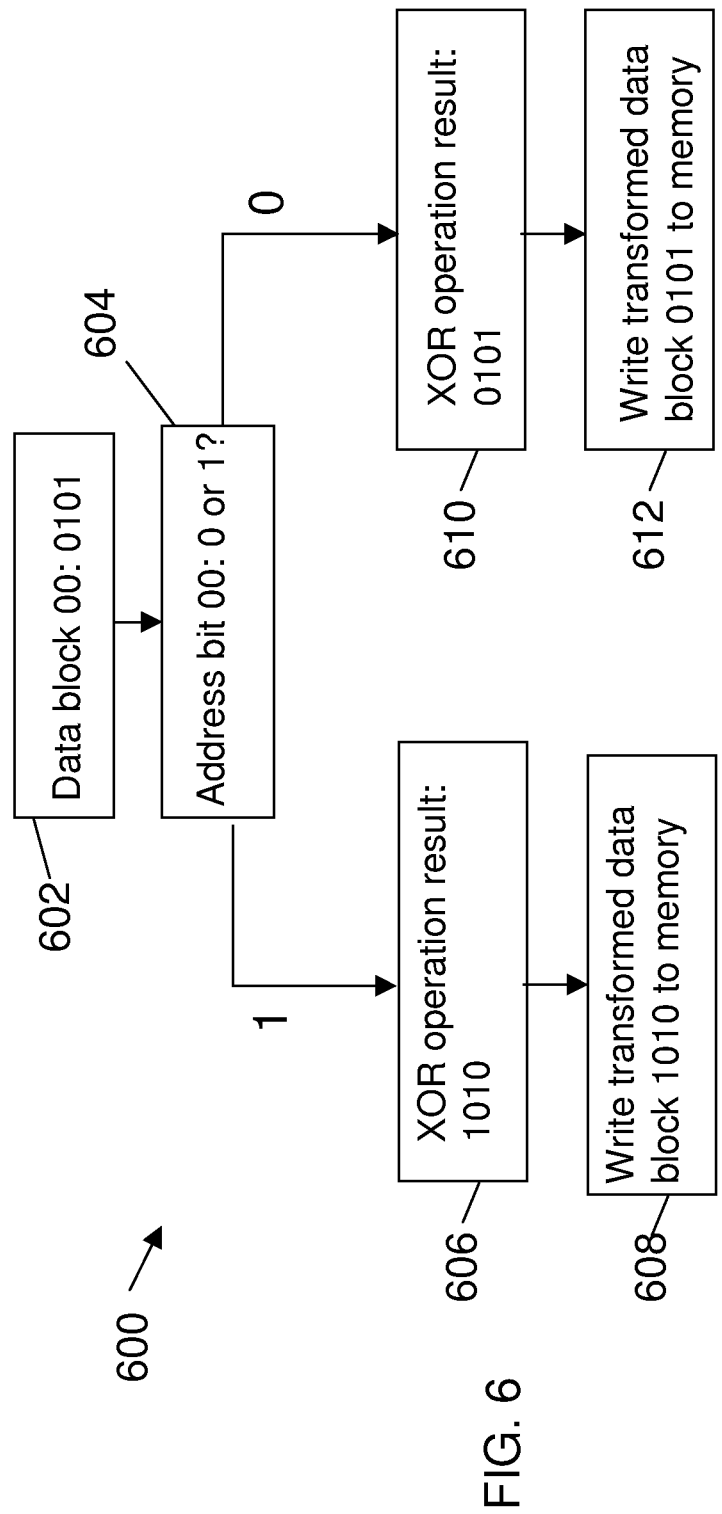
FIG. 6 depicts a process flow for transforming write data using an XOR bitwise operation performed on a block of data in accordance with an embodiment.

FIG. 6 is an exemplary process flow 600 showing an XOR bitwise operation performed on a block of data. In block 602, exemplary data block 00 comprises the bits 0101, wherein a block 604 checks the corresponding address bit 00. If the address bit 00 is a 1, block 606 performs the XOR operation using the 1 value, thus resulting in transformed data 1010. In block 608, the transformed data block is written to memory. If the address bit 00 is a 0, a block 610 performs the XOR operation using the 0 value, thus resulting in transformed data 0101. In block 612, the transformed data block is written to memory. Thus, the operation causes the value for each bit of the data block 00 to be dependent on the address bit 00 value.

Referring back to FIG. 5, in process 502, the transformed block 00 is written to a location in memory after being transformed using the XOR bitwise operation. Similarly, in processes 504 and 506, data blocks 01 and 02 are transformed based on address bits 01 and 02, respectively. The processes 504 and 506 produce the transformed blocks 01 and 02, respectively, which are written to memory. These processes are performed on each data block of the write data, up to data block 31, which, in process 508, produces transformed block 31 of data based on the value of address bit 31. Accordingly, each block of data is transformed using the XOR bitwise operation based on a corresponding value in the address before it is written to memory. During a data read process, this transformed data is transformed again to produce read data, which, if the data is written to the correct address, will be equal to the write data as it was originally received. Each of the processes 502, 504, 506, 508 may be performed in parallel to each other. In an embodiment, since the bitwise operations are substantially basic, the address-based transform of the write data does not take longer than the ECC generation (e.g., ECC generation block 300 in FIG. 3) and, thus, does not affect latency of write operations.

Figure 7:
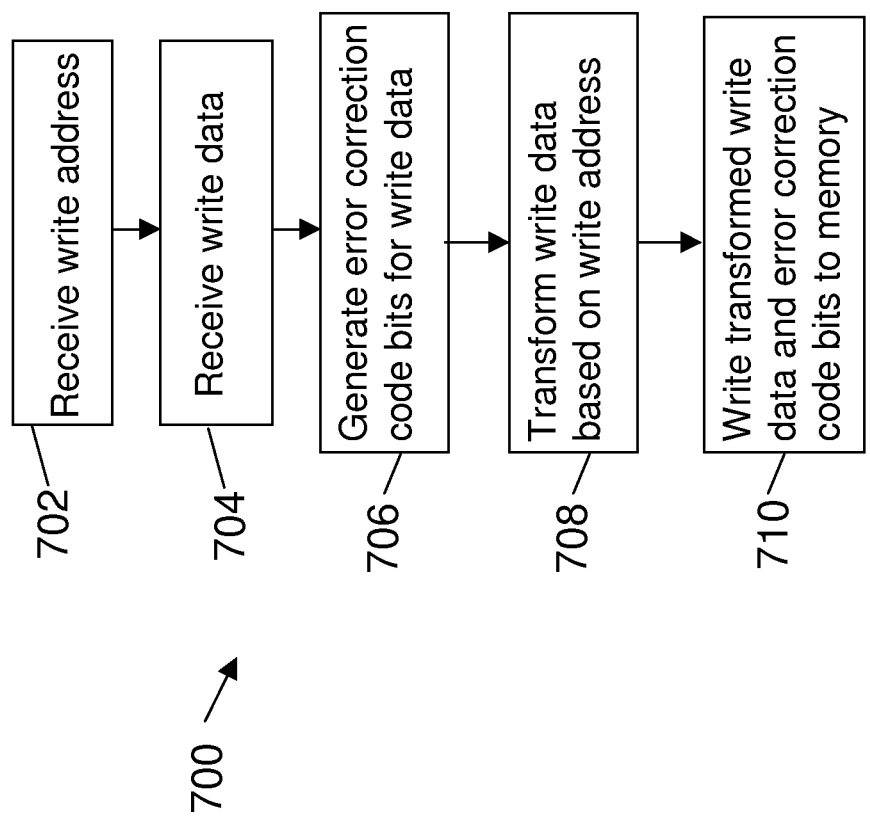
FIG. 7 depicts a process flow for writing data to memory with address error identification in accordance with an embodiment.

FIG. 7 is a block diagram of a process for writing data to memory with data and address error identification in accordance with an embodiment. In block 702, the write address is received. The write data is received in block 704. In block 706, ECC bits are generated for the write data. In block 708, the write data is transformed based on, or responsive to, the write address. As described above, the write data may be broken into data blocks, where each block is transformed based on a corresponding address bit. In block 710, the transformed write data also transformed write data and ECC bits are written to memory. In embodiments, the transformed write data and ECC bits are written to a location in memory corresponding to the received write address. The depicted system and method will determine an error if one or more blocks of data are written to the wrong address.

Figure 8:
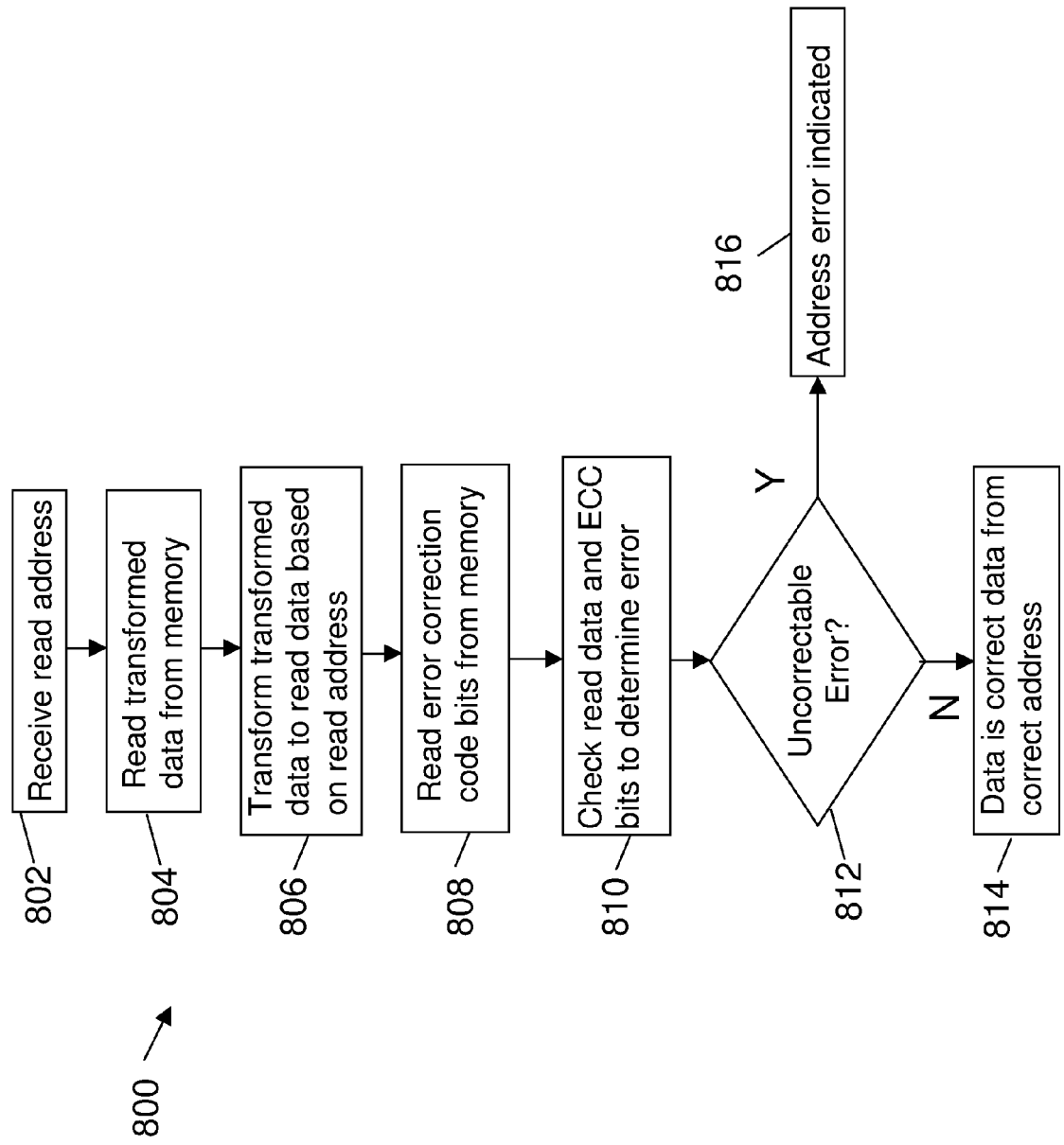
FIG. 8 depicts a process flow for reading data from memory with address error identification in accordance with an embodiment.

FIG. 8 is a block diagram of a process for reading data from memory with data and address error identification in accordance with an embodiment. In block 802, the read address is received. In block 804, the transformed data (also referred to as "transformed read data") is read from a location (also referred to as "read location") in memory corresponding to the read address. In block 806, the transformed data is transformed to read data based on, or responsive to, the read address. In block 808, ECC bits are read from memory as well. In block 810 the read data (after transforming) is checked using the ECC bits to determine if there is an error. If the data was stored at the correct address and read from the correct address, no error based on the address (and corresponding transform) will be generated in block 812. Thus, the data will be the correct data for the address, as indicated in block 814. If the data was stored at the incorrect address, an uncorrectable error will be generated in the block 812, which is then indicated in block 816. As discussed above, the exemplary XOR bitwise transform performs an operation on each bit in the data, and will thus produce an uncorrectable error.

Technical effects and benefits include the ability to identify errors in the address where data has been written or the address where the data is read from. Embodiments utilize a basic transform of the data based on the address when reading and writing the data to determine if an address error has occurred during the read and/or write. In an embodiment, the system and method determine an address error without affecting latency for write and/or read operations. In addition, the system and method use the same amount of memory space as typical ECC systems use.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method comprising:
   receiving a read address corresponding to a read location in a memory;
   reading data from the read location in the memory, the data comprising a plurality of data bits grouped into data blocks;
   transforming, at a computer, the data responsive to the data and the read address to produce transformed read data, the transforming comprising:
      assigning corresponding bits from the read address to the data blocks; and
      performing a logic operation on each data block based on a value of the corresponding bit from the read address;
   reading error correction code (ECC) bits associated with the transformed read data;
   determining whether the read address has an address error responsive to the transformed read data and the ECC bits; and
   generating an error responsive to determining that the read address has an address error.

2. The method of claim 1, wherein the error is an uncorrectable error (UE).

3. The method of claim 1, wherein the address error is caused by a mismatch between the read address and the read location.

4. The method of claim 1, wherein the address error is caused by a mismatch between the read address and the data.

5. The method of claim 1, wherein the logic operation is an exclusive-or (XOR).

* * * * *